United States Patent [19]
Matsumoto

[11] Patent Number: 5,323,042
[45] Date of Patent: Jun. 21, 1994

[54] ACTIVE MATRIX LIQUID CRYSTAL DISPLAY HAVING A PERIPHERAL DRIVING CIRCUIT ELEMENT

[75] Inventor: Hiroshi Matsumoto, Hachioji, Japan

[73] Assignee: Casio Computer Co., Ltd., Tokyo, Japan

[21] Appl. No.: 975,852

[22] Filed: Nov. 13, 1992

[30] Foreign Application Priority Data

Nov. 25, 1991 [JP] Japan ................. 3-334597

[51] Int. Cl.$^5$ ............ H01L 27/01; H01L 29/04; H01L 3/036; H01L 29/76
[52] U.S. Cl. ................. 257/350; 257/59; 257/72; 257/408; 257/351
[58] Field of Search ............. 257/57, 59, 66, 72, 257/344, 408, 347, 350, 351

[56] References Cited

U.S. PATENT DOCUMENTS 3,840,695 10/1974 Fischer ..................... 257/350
4,663,645 5/1987 Komori et al. .............. 257/408

FOREIGN PATENT DOCUMENTS 0342925 11/1989 European Pat. Off. ....... 257/72
0356039 2/1990 European Pat. Off. ....... 257/408

OTHER PUBLICATIONS

Patent Abstracts of Japan, vol. 7, No. 258 (E-211)(1403) Nov. 17, 1983 & JP-A-58 142 566 (Suwa Seikosha K.K.) Aug. 24, 1983.

Primary Examiner—Rolf Hille
Assistant Examiner—Steven Loke
Attorney, Agent, or Firm—Frishauf, Holtz, Goodman & Woodward

[57] ABSTRACT

In the case of an LDD-structure thin film transistor, an on-current becomes large as impurity concentration of low level impurity source and drain regions is increased. Then, when the impurity concentration is increased to a first impurity concentration, the on-current reaches to a substantially maximum point. On the other hand, a cut-off current $I_{off}$ becomes substantially minimum when the impurity concentration is decreased to a second impurity concentration. The cut-off current is gradually increased even if the impurity concentration becomes higher or lower than the second impurity concentration. Therefore, impurity concentration of low level impurity source and drain regions of a thin film transistor for a peripheral circuit is set to a first impurity concentration, and that of low concentration impurity source and drain regions of a thin film transistor for a matrix circuit is set to a second impurity concentration.

10 Claims, 3 Drawing Sheets

ACTIVE MATRIX LIQUID CRYSTAL DISPLAY HAVING A PERIPHERAL DRIVING CIRCUIT ELEMENT

BACKGROUND OF THE INVENTION

1. Field of the Invention

The present invention relates to a thin film transistor device having a matrix circuit for applying an electric field to a liquid crystal display device and a driving circuit for driving the matrix circuit.

2. Description of the Related Art

For example, there is used an active matrix type liquid crystal display comprising a matrix circuit for applying an electric field to a liquid crystal display device and a peripheral driving circuit for driving the matrix circuit, each circuit being formed of field effect type thin film transistors.

FIG. 4 shows one example of the circuit structure of such a conventional active matrix type liquid crystal display.

This active matrix type liquid crystal display comprises a matrix circuit 1, one peripheral driving circuit 2 for supplying a scanning signal to an address bus of the matrix circuit 1, and other peripheral driving circuit 3 for supplying a display signal to a data bus of the matrix circuit 1. In the matrix circuit 1, there are formed a large number of scanning electrodes 4 arranged in row and a large number of display electrodes 5 arranged in column, and a thin film transistor 7 for the matrix circuit is formed for each pixel 6 (liquid crystal) corresponding to each cross point of the scanning electrodes 4 and the display electrodes 5. A gate electrode of each thin film transistor 7 is connected to each scanning electrode 4, and a source electrode is connected to the display electrode 5. A drain electrode of each thin film transistor 7 is connected to a pixel capacitive element 8 having a transparent electrode connected to each pixel in parallel. One peripheral circuit 2 comprises a thin film transistor (not shown) for one peripheral circuit, connected to one end of the scanning electrode 4. Other peripheral circuit 3 comprises a thin film transistor for other peripheral circuit, connected to one end of the scanning electrode 5. Then, if the thin film transistor 7 for matrix circuit is turned on, display data is written to the capacitive element 8 in the form of an electric charge. If the thin film transistor 7 for matrix circuit is turned off, the pixel 6 is driven in a predetermined time by the written electric charge.

According to such a conventional thin film transistor device, the thin film transistor 7 forming the matrix circuit 1 and the thin film transistor forming the peripheral driving circuit were formed in the same structure. Therefore, characteristics of the transistor such as a switching speed of the thin film transistor, a cut-off speed or the like were the same in both transistors.

In recent years, display with extremely high precision has been required in the active matrix type liquid crystal display, and it has been needed that the number of thin film transistors which form the matrix circuit 1 and the peripheral driving circuits 2 and 3, is increased.

However, as the number of the thin film transistors is increased, the consumption current to be consumed in the entire device is increased. In order to solve this problem, the cut-off current of each thin film transistor 7 must be controlled to be small. On the other hand, the switching speed of each thin film transistor must be increased in accordance with increase in the number of the thin film transistors. However, as is well-known, the on-current must be increased in order to increase the switching speed, and the cut-off current is also increased by the increase in the on-current. For this reason, the above two requirements cannot be satisfied.

SUMMARY OF THE INVENTION

An object of the present invention is to provide a thin film transistor device wherein the number of thin film transistors, which forms a matrix circuit and peripheral driving circuits, can be considerably increased, an on-current can be increased, and a cut-off current can be reduced.

The thin film transistor device of the present invention comprises a first thin film transistor including a semiconductor layer having a channel region, source and drain regions, coupled to ends of the channel region and having low level impurity region and high level impurity region, a gate insulating film, a gate electrode, and source and drain electrodes; and a second thin film transistor having a semiconductor layer including a channel region, source and drain regions coupled to ends of the channel region and having a low level impurity region and a high level impurity regions, a gate insulating film, a gate electrode, and source and drain electrodes, impurities existing in the first thin film transistor and those in the second thin film transistor being of the same conductive type, and concentration of the low impurity level regions of the first thin film transistor set to be higher than that of the low level impurity regions of the second thin film transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
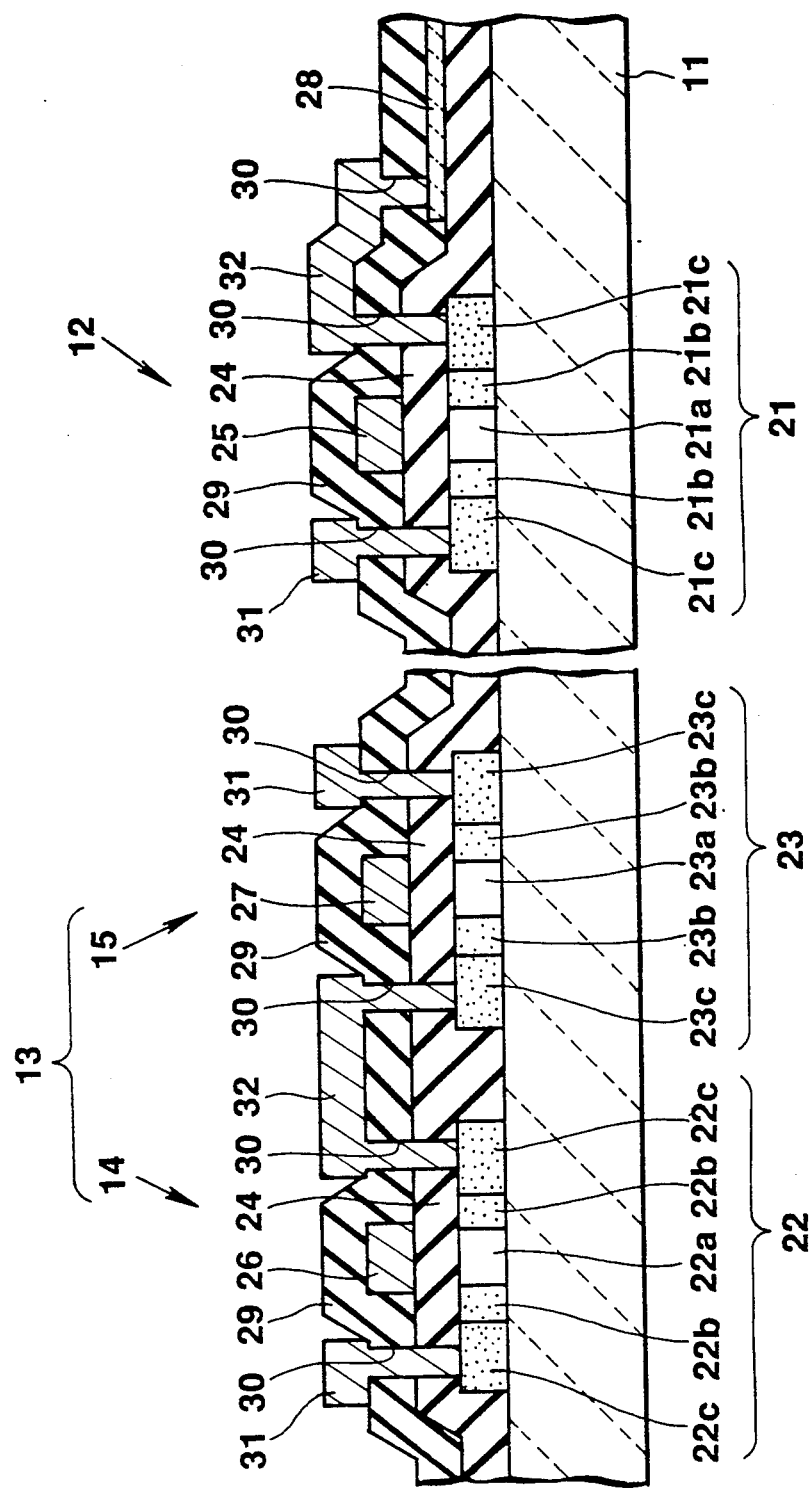
FIG. 1 is an enlarged cross sectional view showing one embodiment of a thin film transistor device according to the present invention.

FIG. 1 shows a thin film transistor device according to the present invention.

In the thin film transistor device, a thin film transistor 12 for a matrix circuit, which is formed of an NMOS thin film transistor, and a thin film transistor 13 for a peripheral circuit, which is formed of a CMOS thin film transistor, are formed on each predetermined portion of the upper surface of a transparent substrate 11 formed of glass or the like. The thin film transistor 13 for a peripheral circuit, which is formed of the CMOS thin film transistor, comprises an NMOS thin film transistor 14 and a PMOS thin film transistor 15.

The thin film transistors 12, 14, and 15 comprise semiconductor thin films which are patterned on each predetermined portion of the upper surface of the transparent substrate 11. The thin film transistors 12, 14, and 15 are LDD(Lightly Doped Drain) structured. In details, the central portions of the semiconductor thin films 21, 22, 23 of the thin film transistors 12, 14, 15 are used as channel regions 21a, 22a, and 23a, respectively, and both sides of the channel regions 21a, 22a, 23a are used as source and drain regions 21b, 22b, 23b, which are formed of low impurity concentration regions. Moreover, both sides of the source and drain regions 21b, 22b, 23b are used as source and drain regions 21c, 22c, 23c, which are formed of high level impurity regions. A gate insulating film 24 is formed on the entire surface of the semiconductor thin films 21, 22, 23, and the transparent substrate 11. Gate electrodes 25 to 27 are formed on the respective portions of the upper surface of the gate insulating film 24 each corresponding to the channel regions 21a, 22a, 23a. A transparent capacitive electrode 28, which is formed of ITO (Indium Tin Oxide), is formed on a predetermined portion of the upper surface of the gate insulating film 24. A passivating insulating films 29 is formed on the entire surface of the gate insulating films 24, the gate electrodes 25 to 27, and the transparent capacitive electrode 28. Contact holes 30 are formed at the portions of the passivating film 29 and the gate insulating film 24 which correspond to the high level impurity source and drain regions 21c, 22c and 23c. Source and drain electrodes 31, 32 are formed in the contact holes 30 and on predetermined portions of the upper surface of the passivating film 29. In this case, one of source and drain electrodes 31, 32 of the thin film transistor 12 for the matrix circuit is connected to one end portion of the transparent capacitive electrode 28. Moreover, one of source and drain regions 22c of NMOS thin film transistor 14 and one of source and drain regions 23c of PMOS thin film transistor 15 are electrically connected to each other through a drain electrode 32 such that one CMOS thin film transistor is formed by a pair of thin film transistors 14 and 15.

For the above structured thin film transistor device, note that impurity concentration of the low level impurity source and drain regions 22b of the NMOS transistor 14, which forms the thin film transistor 13 for the peripheral circuit, is higher than of the low level impurity source and drain regions 21b of the thin film transistor 12 for the matrix circuit.

Figure 2:
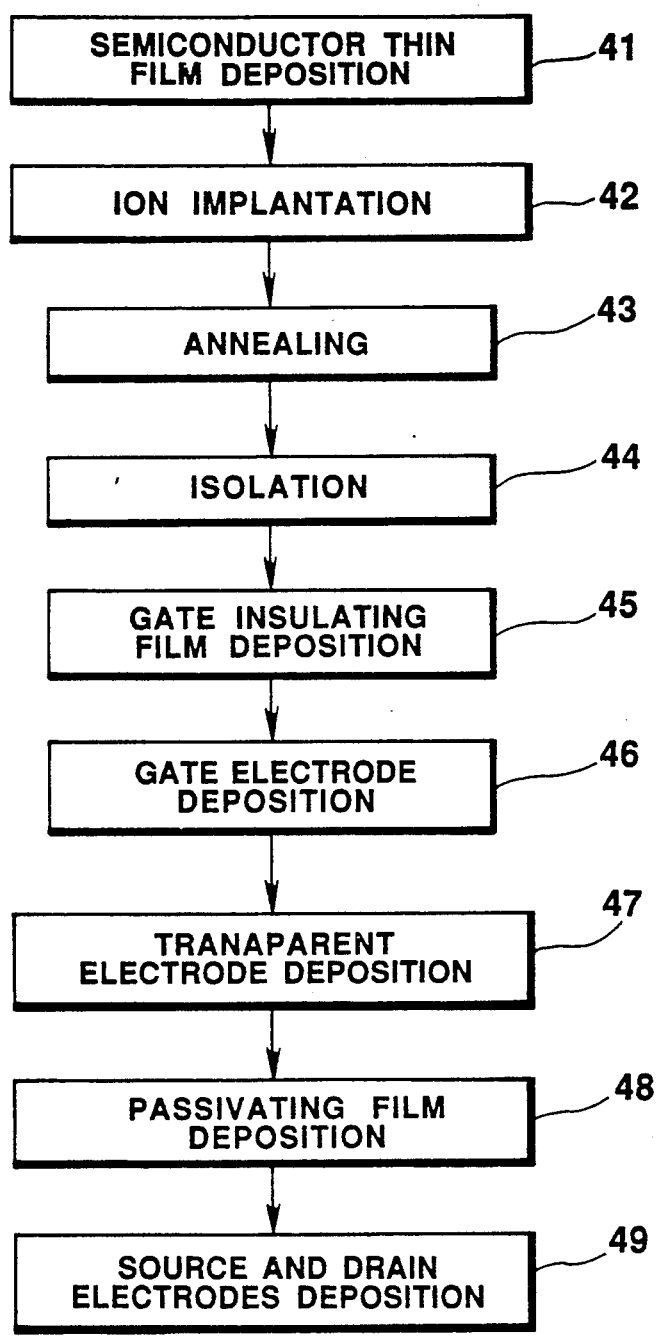
FIG. 2 is a flow chart showing the processes of manufacturing the thin film transistor device of FIG. 1.

A method for manufacturing the thin film transistor device will be explained with reference to FIG. 2 showing the processes of manufacturing the thin film transistor device.

First, in a semiconductor thin film deposition process 41, an amorphous silicon film for forming semiconductor thin films 21 to 23 is deposited to have a thickness of about 500Å on the entire surface of the transparent substrate 11 by plasma CVD. In an ion implantation process 42, an oxide film serving as a protection film for ion-implantation is deposited to have a thickness of about 1400Å on the entire upper surface of the amorphous silicon film by a sputtering device. Thereafter, photoresist is used as a mask, and impurities are implanted five times in the following manner by an ion-implantation device.

At the first ion implantation, a phosphorus ion is implanted in the portions of the amorphous silicon film where the low level impurity source and drain regions 21b of the thin film transistor 12 for the matrix circuit are to be formed, under the conditions of acceleration energy of 130 keV and a dose of $1 \times 10^{13}$ atom/cm$^2$.

At the second ion implantation, a phosphorus ion is implanted in the portions of the amorphous silicon film where the low level impurity source and drain regions 22b of the NMOS thin film transistor 14 as an element of the thin film transistor 13 for the peripheral circuit are to be formed, under the conditions of acceleration energy of 130 keV and a dose of $5 \times 10^{13}$ atom/cm$^2$.

At the third ion implantation, a boron ion is implanted in the portions of the amorphous silicon film where the low level impurity source and drain regions 23b of the PMOS thin film transistor 15 as an element of the thin film transistor 13 for the peripheral circuit are to be formed, under the conditions of acceleration energy of 40 keV and a dose of $5 \times 10^{13}$ atom/cm$^2$.

At the fourth ion implantation, a phosphorus ion is implanted in the portions of the amorphous silicon film where the high level impurity source and drain regions 21c, 22c of the NMOS thin film transistors 12 and 14, respectively, for the peripheral circuit are to be formed, under the conditions of acceleration energy of 130 keV and a dose of $3 \times 10^{15}$ atom/cm$^2$.

At the fifth ion implantation, a boron ion is implanted in the portions of the amorphous silicon film where the high level impurity source and drain regions 23c of the PMOS thin film transistor 15 for the peripheral circuit are to be formed, under the conditions of acceleration energy of 40 keV and a dose of $1 \times 10^{15}$ atom/cm$^2$.

Thereafter, an oxide film serving as a protection film for ion implantation is etched.

In an annealing process 43, an XeCl eximer laser is irradiated on the amorphous silicon film. Thereby, the amorphous silicon film is crystallized into a polysilicon film, and the implanted impurities are activated. In an isolation process 44, an unnecessary portion of the polysilicon film is etched, so that each of semiconductor thin films 21, 22, 23 is shaped in an island on each predetermined portion of the upper surface of the transparent substrate 11. As already explained, since impurities are implanted in the silicon films and activated, the central portions of the semiconductor thin films 21, 22, 23 which remains the intrinsic semiconductor, are used as channel regions 21a, 22a, and 23a, respectively. Both sides of the channel regions 21a, 22a, 23a are used as low impurity diffusion regions. Moreover the outer side of each of low impurity diffusion regions are used as high impurity diffusion regions.

In a gate insulating film deposition process 45, the gate insulating film 24, which is formed of silicon oxide or silicon nitride, is deposited to have a thickness of about 1000 to 1500Å on the entire surfaces of the substrate 11 and the semiconductor films 21 to 23 by sputtering or plasma CVD. In a gate electrode deposition process 46, gate electrodes 25 to 27, which are formed of aluminum chrome or the like, are formed by patterning to have a thickness of about 1000Å on the upper surface of the gate insulating film 24, each corresponding to the channel regions 21a, 22a, 23a, by a sputtering device. In a transparent electrode deposition process 47, the transparent capacitive electrode 28, which is formed of ITO, is formed and patterned on a predetermined portion of the upper surface of the gate insulating film 24 to have a thickness of about 500Å. In a passivating film deposition process 48, the layer insulating film 29, which is formed of silicon nitride, is deposited to have a thickness of about 3000Å on the entire surfaces of the gate insulating film 24 and the gate electrodes 25 to 27, and the transparent electrode 28, by plasma CVD. In source and drain electrodes deposition process 49, the contact holes 30 are formed at the portions of the passivating film 29 and the gate insulating film 24 which correspond to high level impurity source and drain regions 21c, 22c, 23c, and one end the transparent electrode 28. Thereafter, the source and drain electrodes 31, 32, which are formed of aluminum, are formed to have a thickness of about 5000Å, in the contact holes 30 and on predetermined portions of the upper surface of the layer insulating film 29 by the sputtering device. In this way, the matrix circuit driving device is manufactured.

Figure 3:
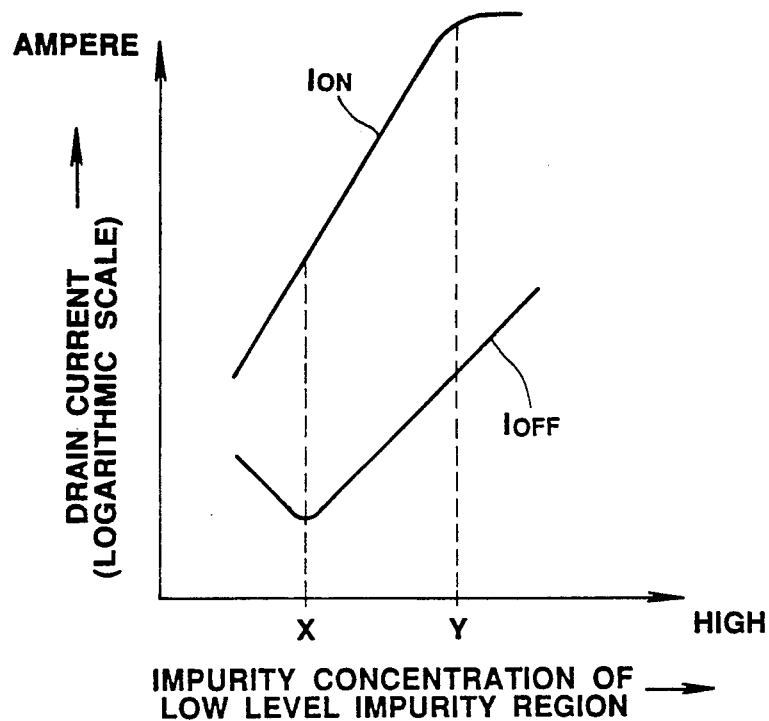
FIG. 3 is a view showing the relationship between concentration of low level impurity regions and a drain current according to the thin film transistor structured as shown in FIG. 1.
Figure 4:
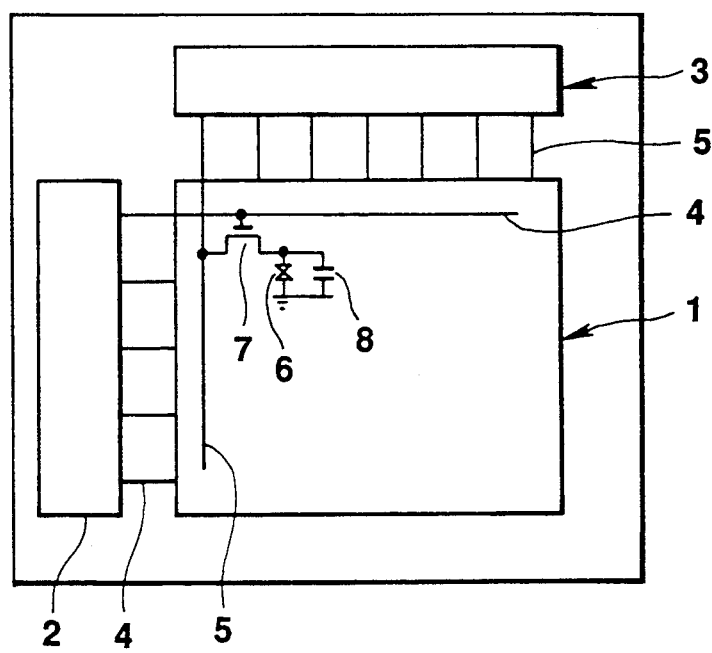
FIG. 4 is a plane view showing a conventional active matrix type liquid crystal display.

FIG. 3 is a view showing the relationship between impurity concentration of the source and drain regions existing low level impurities according to the thin film transistors 12 and 14 and a drain current. As is obvious from the FIGURE, an on-current $I_{on}$ becomes larger as impurity concentration is higher, and at the impurity concentration Y, the on-current $I_{on}$ reaches to a substantially maximum point. On the other hand, the cut-off current $I_{off}$ becomes substantially minimum at the impurity concentration X (X<Y), and gradually increased even if the impurity concentration becomes larger or smaller than impurity concentration X.

According to the thin film transistor device as described above at the first ion implantation, the phosphorus ion is implanted in the low level impurity source and drain regions 21b of the thin film transistor 12 under the conditions of acceleration energy of 130 keV and a dose of $1 \times 10^{13}$ atom/cm$^2$. Then, at the second ion-implantation, the phosphorus ion is implanted in the low level impurity source and drain regions 22b of the NMOS thin film transistor 14 under the conditions of acceleration energy of 130 keV and a dose of $5 \times 10^{13}$ atom/cm$^2$. Therefore, the impurity concentration of the source and drain regions 22b of the thin film transistor 14 is higher than that of the source and drain regions 21b of the thin film transistor 12. The impurity concentration of the source and drain regions 22b of the thin film transistor 14 is substantially maximum point Y of the on-current $I_{on}$. The impurity concentration of the source and drain regions 21b of the thin film transistor 12 is substantially minimum point X of the cut-off current $I_{off}$. Therefore, in the NMOS thin film transistor 14, constituting the thin film transistor 13 for the peripheral circuit, the on-current is set to maximum, that is, the switching speed is set to maximum. Also, in the thin film transistor 12 for the matrix circuit, the cut-off current is set to minimum.

According to the above embodiment, the semiconductor thin films 21, 22, 23 were directly formed on the upper surface of the transparent substrate 11. However, the present invention is not limited to the above embodiment. More specifically, a ground layer, which is formed of silicon oxide or silicon nitride, is formed on the upper surface of the transparent substrate 11, and the semiconductor thin films 21, 22, 23 may be formed on the upper surface of the ground layer. The peripheral circuit 13 may be formed on a substrate different from the substrate on which the matrix circuit 12 is formed. The peripheral circuit 13 may be formed of either the NMOS thin film transistor 14 or the PMOS thin film transistors. In the above embodiment, the PMOS thin film transistor was formed in only the peripheral circuit, and not formed in the matrix circuit. Due to this, the impurity concentration was determined so as to satisfy the performance which is required in the peripheral circuit. In the case where the PMOS thin film is formed in the matrix circuit, the impurity concentration of the low level impurity source and drain regions for the peripheral circuit may be higher than that of the matrix circuit. The above embodiment explained the case that the low level impurity regions are formed in the source regions. However, the low level impurity regions may be not formed in the source region. Moreover, the present invention can be widely applied to a thin film transistor memory, an image sensor or the like other than the liquid crystal display.

According to the present invention, the impurity concentration of the low level impurity region of the thin film transistor formed in the peripheral circuit is higher than that of the low level impurity region of the thin film transistor formed in the matrix circuit. Therefore, the on-current can be sufficiently enhanced and the cut-off current can be sufficiently lowered. In addition, the switching speed can be higher, and a display quality can be improved.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A thin film transistor device comprising:
   a first thin film transistor including a semiconductor layer having a channel region, and source and drain regions coupled to ends of the channel region and each having a low level impurity region and a high level impurity region, a gate insulating film, a gate electrode, and source and drain electrodes; and
   a second thin film transistor including a semiconductor layer having a channel region, and source and drain regions coupled to ends of the channel region and each having a low level impurity region and a high level impurity region, a gate insulating film, a gate electrode, and source and drain electrodes,
   the impurities existing in said first thin film transistor and those in said second thin film transistor having the same conductive type, and the concentration of said low level impurity region of said first thin film transistor is set to be higher than that of said low level impurity region of said second thin film transistor, wherein the impurity concentration of said low level impurity region in each of said source and drain regions of said first thin film transistor is selected to correspond to substantially a maximum point of an on-current.

2. The thin film transistor device according to claim 1, wherein said first and second thin film transistors are NMOS field effect type thin film transistors.

3. The thin film transistor device according to claim 1, wherein the impurity concentration of said low level impurity region in each of said source and drain regions of said first thin film transistor is several times as high as that of said low level impurity region in each of said source and drain regions of said second thin film transistor.

4. The thin film transistor device according to claim 1, wherein includes an insulating substrate on which a plurality of said second thin film transistors are formed in matrix to constitute a matrix circuit section.

5. The thin film transistor device according to claim 4, wherein a plurality of said first thin film transistors are formed on the outer periphery of said matrix circuit section to constitute driving circuit sections for driving said second thin film transistors.

6. A thin film transistor device comprising:
a first thin film transistor including a semiconductor layer having a channel region, and source and drain regions coupled to ends of the channel region and each having a low level impurity region and a high level impurity region, a gate insulating film, a gate electrode, and source and drain electrodes; and
a second thin film transistor including a semiconductor layer having a channel region, and source and drain regions coupled to ends of the channel region and each having a low level impurity region and a high level impurity region, a gate insulating film, a gate electrode, and source and drain electrodes,
the impurities existing in said first thin film transistor and those in said second thin film transistor having the same conductive type, and the concentration of said low level impurity region of said first thin film transistor is set to be higher than that of said low level impurity region of said second thin film transistor, wherein the impurity concentration of said low level impurity region in each of said source and drain regions of said second thin film transistor is selected to correspond to substantially a minimum point of a cut-off current.

7. A thin film transistor device comprising:
a transparent substrate;
a matrix circuit section including second field effect type thin film transistors formed on said transparent substrate in matrix, each comprising a semiconductor layer having a drain region having a low level impurity region and a high level impurity region; and
a driving circuit section including a plurality of first field effect type thin film transistors formed on said transparent substrate in matrix, on the outer periphery of said matrix circuit section, each having the same channel type as each of said second thin film transistors and comprising a semiconductor layer including a drain region having a low level impurity region and a high level impurity region;
the impurity concentration of said low level impurity region of each of said first thin film transistors being higher than that of said low level impurity region of each of said second thin film transistors;
pixel electrodes for applying an electrical field to a liquid crystal, to each of which each of said second thin film transistors is connected; and
wherein the impurity concentration of said low level impurity region of each of said first thin film transistors is selected to correspond to substantially a maximum point of an on-current.

8. The thin film transistor device according to claim 7, wherein said first and second thin film transistors are NMOS field effect type thin film transistors.

9. The thin film transistor device according to claim 7, wherein the impurity concentration of said low level impurity region of each of said first thin film transistors is several times as large as that of each of said low level impurity regions of said second thin film transistors.

10. A thin film transistor device comprising:
a transparent substrate;
a matrix circuit section including second field effect type thin film transistors formed on said transparent substrate in matrix, each comprising a semiconductor layer having a drain region having a low level impurity region and a high level impurity region; and
a driving circuit section including a plurality of first field effect type thin film transistors formed on said transparent substrate in matrix, on the outer periphery of said matrix circuit section, each having the same channel type as each of said second thin film transistors and comprising a semiconductor layer including a drain region having a low level impurity region and a high level impurity region;
the impurity concentration of said low level impurity region of each of said first thin film transistors being higher than that of said low level impurity region of each of said second thin film transistors;
pixel electrodes for applying an electrical field to a liquid crystal, to each of which each of said second thin film transistors is connected;
wherein the impurity concentration of said low level impurity region of each of said second thin film transistors is selected to correspond to substantially a minimum point of a cut-off current.

* * * * *